(12) United States Patent
Lee

(10) Patent No.: US 7,695,992 B2
(45) Date of Patent: Apr. 13, 2010

(54) VERTICAL TYPE CMOS IMAGE SENSOR AND FABRICATING METHOD THEREOF

(75) Inventor: Sang-Gi Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 147 days.

(21) Appl. No.: 11/955,213

(22) Filed: Dec. 12, 2007

(65) Prior Publication Data
US 2008/0150066 A1    Jun. 26, 2008

(30) Foreign Application Priority Data
Dec. 22, 2006    (KR) .................. 10-2006-0133102

(51) Int. Cl.
  *H01L 21/00* (2006.01)
  *H01L 27/148* (2006.01)

(52) U.S. Cl. .................. 438/48; 438/57; 438/69; 438/70; 257/228; 257/290; 257/E31.075; 257/E31.122

(58) Field of Classification Search .................. 438/48, 438/57, 64, 69, 70, 22; 257/228, 229, 290–294, 257/431–436, E31.075, E31.078, E31.081, 257/E31.122; *H01L 31/10, 31/109, 27/148*
See application file for complete search history.

(56) References Cited

U.S. PATENT DOCUMENTS

2006/0081848 A1    4/2006    Niisoe et al.
2008/0157142 A1*    7/2008    Park .......................... 257/292

* cited by examiner

*Primary Examiner*—Hsien-ming Lee
(74) *Attorney, Agent, or Firm*—Sherr & Vaughn, PLLC

(57) ABSTRACT

A vertical-type CMOS image sensor and a fabricating method thereof by which capacitance between an upper line and a dark shield layer can be effectively reduced. The vertical-type CMOS image sensor can include an inter-metal dielectric layer having a plurality of metal lines formed over a semiconductor substrate; a passivation oxide layer formed over the inter-metal dielectric layer, wherein the uppermost surface of the passivation oxide layer includes an inclined portion between a lower portion and an upper portion corresponding to a portion of the inter-metal dielectric layer having a plurality of the metal lines; a dark shield layer formed over the upper portion of the passivation oxide layer; and a nitride layer formed over the semiconductor substrate including the dark shield layer.

13 Claims, 3 Drawing Sheets

VERTICAL TYPE CMOS IMAGE SENSOR AND FABRICATING METHOD THEREOF

The present application claims priority under 35 U.S.C. 119 to Korean Patent Application No. 10-2006-0133102 (filed on Dec. 22, 2006), which is hereby incorporated by reference in its entirety.

BACKGROUND

An image sensor is a device for converting an optical image to an electric signal. Image sensors may be categorized into a complementary metal-oxide-silicon (CMOS) image sensor and a charge coupled device (CCD) image sensor.

The CCD image sensor is considered superior to the CMOS image sensor in characteristics of photosensitivity and noise but has difficulty in achieving highly integrated density and reducing its high power consumption. On the contrary, the CMOS image sensor has simpler processes than those of the CCD image sensor and may be more suitable for achieving highly integrated density and reducing its power consumption.

As semiconductor device fabricating technology has become more highly developed, efforts are actively made to research and develop the CMOS image sensor due to improved fabricating technology and characteristics of CMOS image sensors.

A pixel of a CMOS image sensor may include a plurality of photodiodes for receiving light and CMOS devices for controlling the received light. Electron-hole pairs may be generated in the photodiodes according to wavelength and intensity of red, green and blue rays incident via a color filter. As an output signal varies according to a quantity of the generated electrons, an image can be sensed.

An image sensor such as a CMOS image sensor may include a pixel area for accommodating a photocharge converting unit such as a photodiode and a peripheral circuit area for detecting signals output from the pixel area. In particular, the peripheral circuit area may be provided to surround the pixel area.

Figure 1:
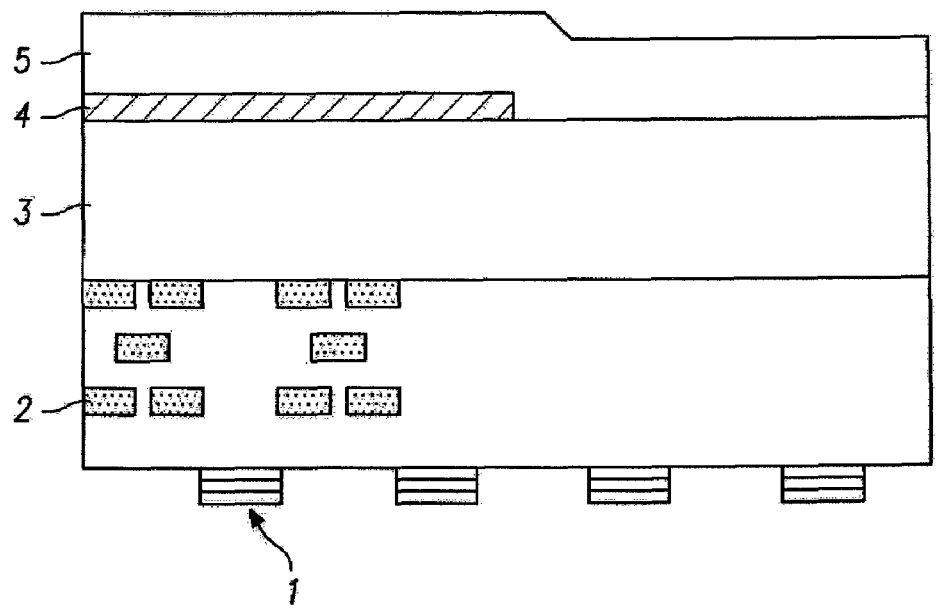

As illustrated in example FIG. 1, a device provided with the above-configured CMOS image sensor may use a metal such as tungsten (W) and the like as dark shield layer 4 for cutoff and anti-reflection of light in a visible ray area. Dark shield layer 4 formed of a thin layer of tungsten may be advantageous in blocking the light transmittance effectively. If so, however, interactive capacitance may increase between upper metal line 2 and dark shield layer 4.

A process for forming dark shield layer 4 may be difficult in performing alignment for defining the dark shield layer. Moreover, upper metal line 2 and dark shield layer 4 may be formed spatially too close to each other, whereby parasitic capacitance increases.

SUMMARY

Embodiments relate to a vertical type CMOS image sensor and a fabricating method thereof that can be particularly suitable for reducing capacitance between an upper line and a dark shield layer.

Embodiments relate to a vertical type CMOS image sensor by which parasitic capacitance attributed to a dark shield layer can be reduced.

Embodiments relate to a method of fabricating a vertical type CMOS image sensor, by which parasitic capacitance attributed to a dark shield layer can be reduced in forming an alignment key for defining the dark shield layer.

Embodiments relate to a method of fabricating a vertical type CMOS image sensor that can include at least one of the following steps: forming an inter-metal dielectric layer having a plurality of metal lines over a semiconductor substrate having a plurality of photodiodes; forming a passivation oxide layer over the inter-metal dielectric layer; forming a first photoresist pattern over a portion of the passivation oxide layer corresponding to the plurality of metal lines; forming an inclined portion of the passivation oxide layer by a wet etching process using the first photoresist pattern; forming a dark shield layer over a portion of the passivation oxide layer corresponding to the portion of the inter-metal dielectric layer having the plurality of metal lines and using the inclined portion of the passivation oxide layer as an alignment key; and then forming a nitride layer over the semiconductor substrate including the dark shield layer.

Embodiments relate to a method of fabricating a vertical type CMOS image sensor that can include at least one of the following steps: forming an inter-metal dielectric layer having a plurality of metal lines over a semiconductor substrate having a plurality of photodiodes; forming a passivation oxide layer over the inter-metal dielectric layer, wherein the uppermost surface of the passivation oxide layer includes an inclined portion between a lower portion and an upper portion corresponding to a portion of the inter-metal dielectric layer having a plurality of the metal lines; forming a dark shield layer over the upper portion of the passivation oxide layer; and then forming a nitride layer over the dark shield layer.

Embodiments relate to a vertical type CMOS image sensor that can include an inter-metal dielectric layer having a plurality of metal lines formed over a semiconductor substrate; a passivation oxide layer formed over the inter-metal dielectric layer, wherein the uppermost surface of the passivation oxide layer includes an inclined portion between a lower portion and an upper portion corresponding to a portion of the inter-metal dielectric layer having a plurality of the metal lines; a dark shield layer formed over the upper portion of the passivation oxide layer; and a nitride layer formed over the semiconductor substrate including the dark shield layer.

DRAWINGS

Example FIG. 1 illustrates a vertical-type CMOS image sensor.

Example FIGS. 2A to 2E illustrate a vertical-type CMOS image sensor and fabricating method thereof, in accordance with embodiments.

DESCRIPTION

Figure 2A:
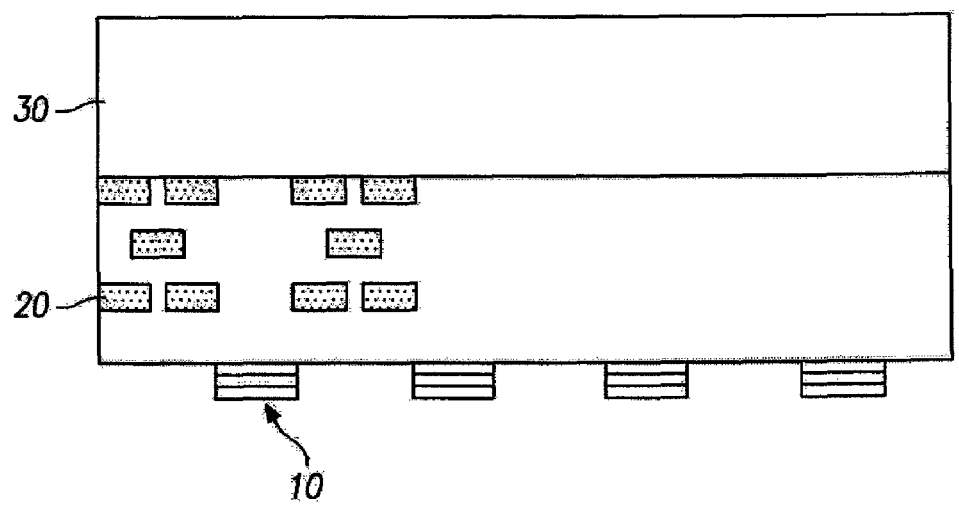

As illustrated in example FIG. 2A, a CMOS image sensor according to the present invention can be formed on and/or over a semiconductor substrate provided with a plurality of photodiodes 10.

An inter-metal dielectric (IMD) layer including a plurality of metal lines 20 can be formed on and/or over the semiconductor substrate. Passivation oxide layer 30 having a low dielectric constant can be deposited to a prescribed thickness on and/or over the IMD layer and can then be planarized by chemical mechanical polishing (CMP).

Thus, passivation oxide layer 30 having the low dielectric constant can reduce parasitic capacitance between metal lines 20 and dark shield layer 50 that will can be formed later. Passivation oxide layer 30 can be formed to a maximum allowable thickness sufficient to suppress the parasitic capacitance between metal lines 20 and dark shield layer 50. For example, passivation oxide layer 30 can have a thickness of between 5000 to 6000 Å.

Figure 2B:
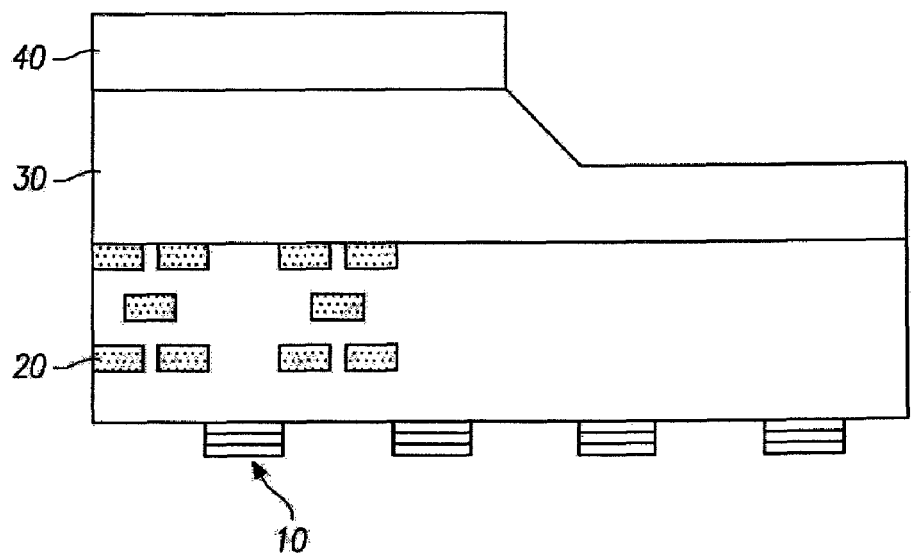

As illustrated in example FIG. 2B, after formation of passivation oxide layer 30, a photoresist can be coated on and/or over passivation oxide layer 30 and then patterned to form first photoresist pattern 40. Subsequently, passivation oxide layer 30 can be etched using first photoresist pattern 40 to form an incline on a portion of the surface of passivation oxide layer 30. In this regard, passivation oxide layer 30 can be etched using a wet-etch process. First photoresist pattern 40 can be formed on and/or over passivation oxide layer 30 corresponding to metal lines 20 in the IMD layer. After completion of the etch using first photoresist pattern 40, a portion of passivation oxide layer 30 corresponding to an area without the metal lines is inclined.

In particular, passivation oxide layer 30 can be formed on and/or over the IMD layer and also has an inclined portion between the area of the IMD layer having a plurality of metal lines 20 embedded therein and another other area of the IMD layer having no metal lines embedded therein.

Figure 2C:
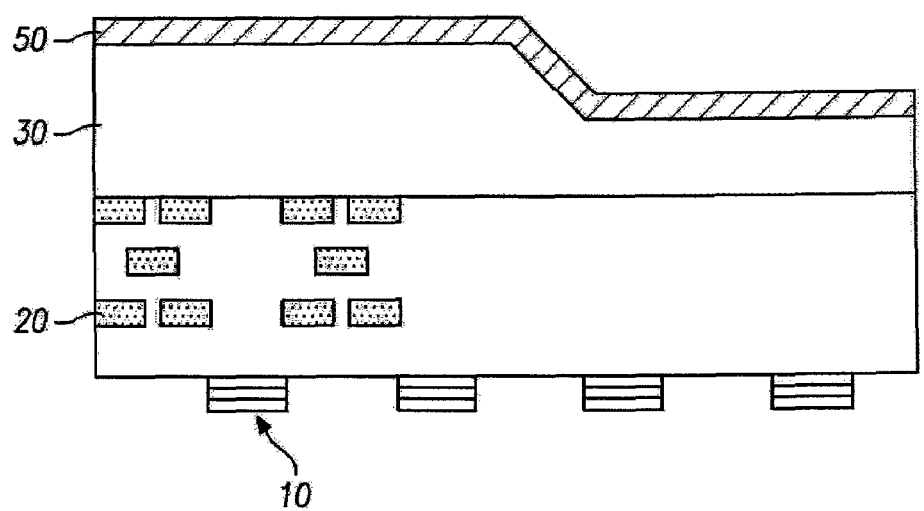

As illustrated in example FIG. 2C, after formation of passivation oxide layer 30, dark shield layer 50 can be formed on and/or over passivation oxide layer 30. Dark shield layer 50 can be formed as a multi-layer structure, such as a double-layer of Ti/TiN. In particular, dark shield layer 50 can be formed by sequentially stacking a Ti layer and a TiN layer on and/or over passivation oxide layer 30.

The stacked sequence of the Ti and TiN layers can be changed according to device implementation. In particular, the Ti layer and the TiN layer of dark shield layer 50 can be formed by PVD such as self-ionized plasma sputtering (SIP) sputtering, hollow cathode magnetron (HCM) sputtering, and the like. The Ti layer can be formed at least 100 um thick using Ti as a target. After formation of the Ti layer, nitrogen gas can be supplied to a chamber to form TiN having thickness of about 300 um.

Figure 2D:
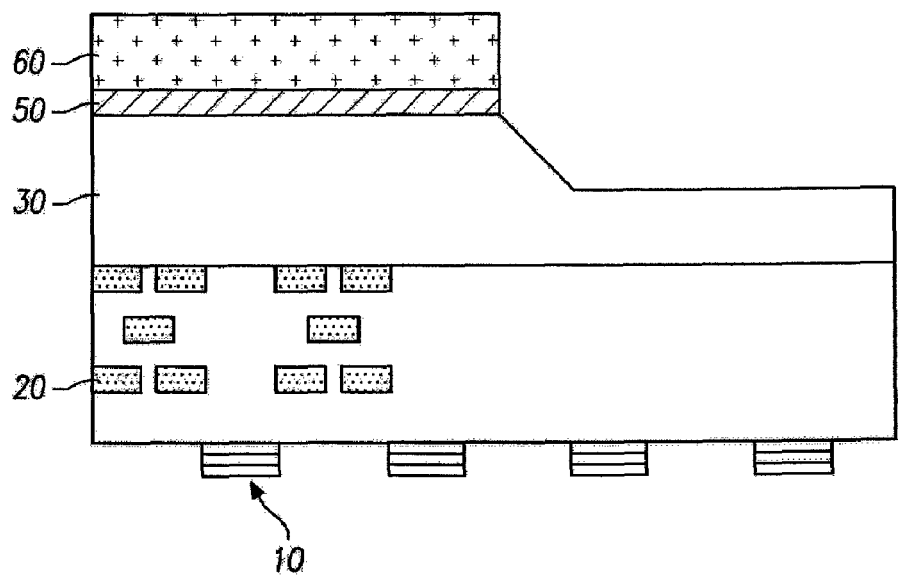

As illustrated in example FIG. 2D, after formation of the double-layered dark shield layer 50 of Ti/TiN, second photoresist pattern 60 can be formed on and/or over dark shield layer 50. Dark shield layer 50 can then be dry-etched and ashed using second photoresist pattern 60. Dark shield layer 50 can be made to remain on and/or over a highest portion of the passivation oxide layer 30. More particularly, dark shield layer 50 can be made to remain on and/or over passivation oxide layer 30 corresponding to metal lines 20 only using the inclined portion of the passivation oxide layer 30 as an alignment key. In this case, dark shield layer 50 of Ti/TiN can be provided to enable the TiN layer to shield the light reflection and the Ti layer to prevent light transmission. So, compared to the use of a tungsten metal layer, dark shied layer 50 can facilitate the reduction in the reflection ratio in a manner that the TiN layer of dark shield layer 50 can absorb a visible ray. Consequently, the absorbed ray can be prevented from propagating forward by the Ti layer.

Figure 2E:
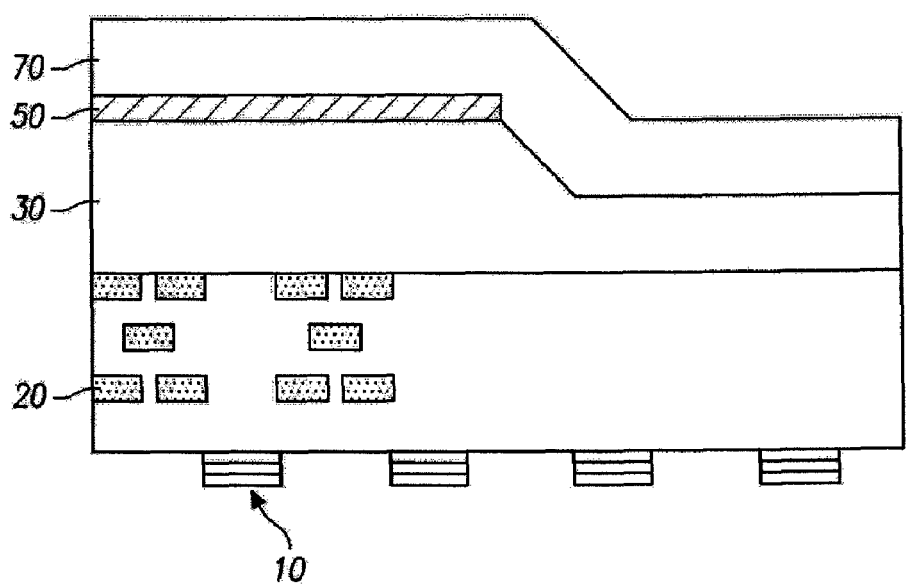

As illustrated in example FIG. 2E, to prevent corrosion of dark shield layer 50 and improve its photoresponse, nitride layer 70 can be deposited on and/or over the entire surface of the substrate including passivation oxide layer 30 and dark shield layer 50.

Accordingly, embodiments can be advantageous in providing an inclined portion to adjust the thickness of passivation oxide layer 30, whereby the inclined portion of passivation oxide layer 30 can be usable as the alignment key in removing dark shield layer 50. Secondly, by adjusting the distance between dark shield layer 50 and metal lines 20, parasitic capacitance can be reduced. Thirdly, the TiN layer of dark shield layer 50 can effectively absorb a visible ray, whereby reflection ratio can be further reduced. Moreover, the absorbed ray can be prevented from propagating forward by the Ti layer of dark shield layer 50.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor comprising:
    forming an inter-metal dielectric layer having a plurality of metal lines over a semiconductor substrate having a plurality of photodiodes;
    forming a passivation oxide layer over the inter-metal dielectric layer;
    forming a first photoresist pattern over a portion of the passivation oxide layer corresponding to the plurality of metal lines;
    forming an inclined portion of the passivation oxide layer by a wet etching process using the first photoresist pattern;
    forming a dark shield layer over a portion of the passivation oxide layer corresponding to the portion of the inter-metal dielectric layer having the plurality of metal lines and using the inclined portion of the passivation oxide layer as an alignment key; and then
    forming a nitride layer over the semiconductor substrate including the dark shield layer.

2. The method of claim 1, wherein forming the passivation oxide layer comprises:
    depositing a passivation oxide layer having a low dielectric constant over the inter-metal dielectric layer; and
    performing chemical mechanical polishing on the passivation oxide layer.

3. The method of claim 1, wherein the passivation oxide layer is formed to a thickness sufficient to suppress parasitic capacitance between the dark shield layer and the plurality of metal lines.

4. The method of claim 3, wherein the thickness of the passivation oxide layer is between 5,000 Å and 6,000 Å.

5. The method of claim 1, wherein the dark shield layer comprises a double-layered structure.

6. The method of claim 1, wherein the dark shield layer comprises a double-layered structure including a Ti layer and a TiN layer.

7. The method of claim 6, wherein the Ti layer is formed over the passivation oxide layer by a PVD process using Ti as a target.

8. The method of claim 7, wherein the PVD process comprises at least one of self-ionized plasma sputtering and hollow cathode magnetron sputtering.

9. The method of claim 7, wherein the Ti layer has a thickness of at least 100 um.

10. The method of claim 6, wherein the TiN layer is formed over the Ti by a PVD process using Ti as a target and then supplying nitrogen gas to a process chamber.

11. The method of claim 10, wherein the PVD process comprises at least one of self-ionized plasma sputtering and hollow cathode magnetron sputtering.

12. The method of claim 11, wherein the TiN layer has a thickness of about 300 um.

13. A method for manufacturing an image sensor comprising:
   forming an inter-metal dielectric layer having a plurality of metal lines over a semiconductor substrate having a plurality of photodiodes;
   forming a passivation oxide layer over the inter-metal dielectric layer, wherein an uppermost surface of the passivation oxide layer includes an inclined portion between a lower portion of the passivation oxide layer and an upper portion of the passivation oxide layer, wherein the upper portion of the passivation oxide layer corresponds to a portion of the inter-metal dielectric layer having a plurality of the metal lines;
   forming a dark shield layer over the upper portion of the passivation oxide layer; and
   forming a nitride layer over the dark shield layer.

* * * * *